(12) United States Patent
Cao et al.

(10) Patent No.: US 10,892,311 B2
(45) Date of Patent: Jan. 12, 2021

(54) DISPLAY DEVICE AND DISPLAY TERMINAL

(71) Applicant: Wuhan China Star Optoelectronics Semiconductor Display Technology Co., Ltd., Wuhan (CN)

(72) Inventors: Haoran Cao, Wuhan (CN); Pilgeun Chun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 46 days.

(21) Appl. No.: 16/349,268

(22) PCT Filed: Aug. 2, 2018

(86) PCT No.: PCT/CN2018/098224
§ 371 (c)(1),
(2) Date: May 12, 2019

(87) PCT Pub. No.: WO2019/174178
PCT Pub. Date: Sep. 19, 2019

(65) Prior Publication Data
US 2020/0176536 A1    Jun. 4, 2020

(30) Foreign Application Priority Data
Mar. 13, 2018    (CN) .......................... 2018 1 0202778

(51) Int. Cl.
*H01L 27/32* (2006.01)
*H01L 51/00* (2006.01)
*H01L 51/52* (2006.01)

(52) U.S. Cl.
CPC ...... *H01L 27/3267* (2013.01); *H01L 27/3276* (2013.01); *H01L 51/0097* (2013.01); *H01L 51/5246* (2013.01); *H01L 2251/5338* (2013.01)

(58) Field of Classification Search
CPC ............. H01L 27/3267; H01L 27/3276; H01L 51/0097; H01L 51/5246; H01L 2251/5338; H01L 27/3244; Y02E 10/549
See application file for complete search history.

(56) References Cited

U.S. PATENT DOCUMENTS 10,254,796 B2 * 4/2019 Isa ........................ G06F 1/1675

* cited by examiner

*Primary Examiner* — Kyoung Lee

(57) ABSTRACT

A display assembly includes a flexible substrate comprising a first section, a connecting section and a second section. A first display device is disposed on the first section. A second display device is disposed on the second section. The second display device comprises a first display section, a foldable section and a second display section connecting with one another in sequence. A metal wire disposed in the connecting section of the flexible substrate is electrically connected to the first display section and the first display device.

20 Claims, 4 Drawing Sheets

DISPLAY DEVICE AND DISPLAY TERMINAL

RELATED APPLICATIONS

This application is a National Phase of PCT Patent Application No. PCT/CN2018/098224 having International filing date of Aug. 2, 2018, which claims the benefit of priority of Chinese Provisional Patent Application No. 201810202778.9 filed on Mar. 13, 2018. The contents of the above applications are all incorporated by reference as if fully set forth herein in their entirety.

FIELD AND BACKGROUND OF THE INVENTION

The present invention relates to an OLED display, and more specifically, to a display device and a display terminal.

Active matrix organic light emitting diode (AMOLED) screen means a screen which is mainly made by AMOLED materials. AMOLED is an active matrix organic light emitting diode. Comparing to conventional LCD panels, AMOLEDs have advantages such as quicker response time, higher contrast, and wider viewing angles.

Conventional AMOLED screens still have some defects such as limited size and shorter product life when compared to TFT screen. However, with continuous technology development, AMOLED screens keep improving and narrow down the gap with respect to TFT screens.

Generally, current mobile phone screens are difficult to be larger than 7 inches. If mobile phone screens are too large, it is inconvenient for users to carry. If mobile phone screens are too small, the display area is too limited to operate and cannot satisfy the user need for a large display area. Due to hand operation and easy portability, the design conflicts with large screens. Therefore, conventional mobile phone with a large screen cannot provide good hand operation and good portability to satisfy users. Thus, defects exist in prior technology and such urgent needs shall be solved.

SUMMARY OF THE INVENTION

An object of the present invention is to provide a display assembly and a terminal device having benefits such as convenient portability and large display area, comprises a flexible substrate, a first display device, a second display device. A flexible substrate comprises, along a horizontally arranged direction, a first section, a connecting section and a second section in sequence. A first display device is disposed on the first section of the flexible substrate. A second display device is disposed on the second section of the flexible substrate, the second display device comprising a first display section, a foldable section and a second display section connecting with one another in sequence. A metal wire is disposed in the connecting section of the flexible substrate and electrically connected to the first display section and the first display device. When in a folded state, an area of a rear surface of the flexible substrate corresponding to the first display device is over another area of the rear surface of the flexible substrate corresponding to the first display section, and a front surface of the first display section is over a front surface of the second display section. A front surface of the first display section and a front surface of the second display section are overlapped. The first display device comprises a first display layer, a first optical glue connection layer and a first transparent protection layer, the first transparent protection layer mounted on a front surface of the first display layer through the first optical glue connection layer.

In the display assembly of the present invention, the second display device comprises a second display layer, a second optical glue connection layer and a flexible transparent protection layer and the flexible transparent protection layer is mounted on the second display layer through the second optical glue connection layer; the first display section, the foldable section and the second display section are located on the second display layer.

In the display assembly of the present invention, the first display layer electrically connects to the second display layer through the metal wire.

In the display assembly of the present invention, the first display layer and the second display layer are flexible display layers.

In the display assembly of the present invention, the first transparent protection layer is a glass cover.

In the display assembly of the present invention, a width of the connecting section is larger than a sum of a thickness of the first display device and a thickness of the second display device.

Furthermore, the present invention provides a display assembly, comprising: a flexible substrate comprising along a horizontally arranged direction, a first section, a connecting section and a second section in sequence; a first display device disposed on the first section of the flexible substrate; a second display device disposed on the second section of the flexible substrate, the second display device comprising a first display section, a foldable section and a second display section connecting with one another in sequence; and a metal wire disposed in the connecting section of the flexible substrate and electrically connected to the first display section and the first display device.

In the display assembly of the present invention, the first display device comprises a first display layer, a first optical glue connection layer and a first transparent protection layer, the first transparent protection layer mounted on a front surface of the first display layer through the first optical glue connection layer.

In the display assembly of the present invention, the second display device comprises a second display layer, a second optical glue connection layer and a flexible transparent protection layer and the flexible transparent protection layer is mounted on the second display layer through the second optical glue connection layer; the first display section, the foldable section and the second display section are located on the second display layer.

In the display assembly of the present invention, the first display layer electrically connects to the second display layer through the metal wire.

In the display assembly of the present invention, the first display layer and the second display layer are flexible display layers.

In the display assembly of the present invention, the first transparent protection layer is a glass cover.

In the display assembly of the present invention, a width of the connecting section is larger than a sum of a thickness of the first display device and a thickness of the second display device.

The present invention provides a terminal device, comprising a case and a display device disposed in the case.

The present invention provides a display assembly and a terminal device and utilizes a flexible substrate to fold the first display device and the second display device partially. The present invention utilizes partially foldable second display device to accomplish the internal folding and to enlarge the display area of the terminal device and to realize good portability.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
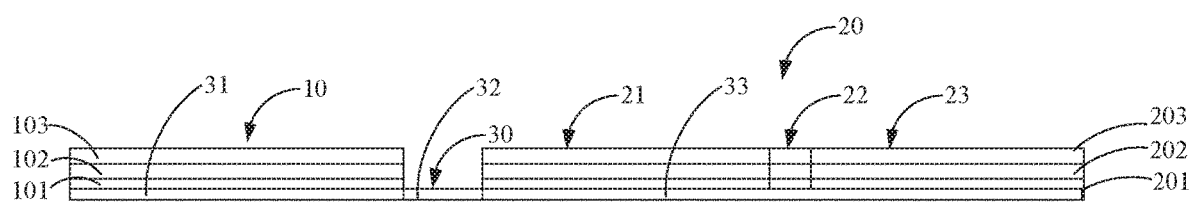
FIG. 1 is a structural schematic diagram of the preferred embodiment of a display assembly in unfolded state according to the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Please refer to FIG. 1. FIG. 1 is a structural schematic diagram of the preferred embodiment of a display assembly in unfolding state according to the present disclosure. It comprises a first display device 10, a second display device 20, and a flexible substrate 30. The first display device 10 and the second display device 20 are disposed on the flexible substrate 30. There is no need to dispose another substrate. A flexible substrate 30 comprises, along a horizontally arranged direction, a first section 31, a connecting section 32 and a second section 33 in sequence. A first display device 10 is disposed on the first section 31 of the flexible substrate 30. The first display device 10 is an OLED display or an AMOLED display. AMOLED is Active-Matrix Organic Light Emitting Diode. The first display device 10 is rectangular or a similar shape.

A second display device 20 is disposed on the second section 33 of the flexible substrate 30. The second display device 20 is an AMOLED display. Along a horizontally arranged direction, the second display device 20 comprises a first display section 21, a foldable section 22 and a second display section 23 connecting with one another in sequence. The second display device 20 is rectangular or in similar shape. The first display section 21, the foldable section 22 and the second display section 23 are also rectangular or in a similar shape. The foldable section 22 is a corresponding area of an AMOLED display which makes the foldable section 22 fold very well.

The flexible substrate 30 is a foldable substrate. A metal wire is disposed in the connecting section 32 of the flexible substrate 30 and electrically connected to the first display section 21 and the first display device 10.

The first display device 10 comprises a first display layer 101, a first optical glue connection layer 102 and a first transparent protection layer 103, the first transparent protection layer 103 mounted on a front surface of the first display layer 101 through the first optical glue connection layer 102. In the preferred embodiments, the first transparent protection layer 103 is a glass cover or other kinds of transparent cover such as transparent layer.

Furthermore, the second display device 20 comprises a second display layer 201, a second optical glue connection layer 202 and a flexible transparent protection layer 203 and the flexible transparent protection layer 203 is mounted on the second display layer 201 through the second optical glue connection layer 202; the first display section 21, the foldable section 22 and the second display section 23 are located on the second display layer 201. The flexible transparent protection layer 203 is made of foldable flexible materials and can be folded with the first display section 21, the foldable section 22 and the second display section 23 and will not fall off.

The first display layer 101 electrically connects to the second display layer 201 through the metal wire.

Specifically, the first display layer 101 and the second display layer 201 are flexible display layers.

The first display layer 101 comprises a first TFT source layer, a first pixel electrode layer and a first OLED layer on the first section 31 of the flexible substrate 30. The first OLED layer includes a cathode layer and a functional layer. The first pixel electrode layer can be used as an anode layer of the first OLED layer. In another example, the first OLED layer includes an anode layer and a functional layer. The first pixel electrode layer can be used as a cathode layer of the first OLED layer. The first TFT source layer and the first pixel electrode layer are formed by the same IGZO thin film by utilizing a forming pattern process.

The second display layer 201 comprises a second TFT source layer, a second pixel electrode layer and a second OLED layer. The second OLED layer includes a cathode layer and a functional layer. The second pixel electrode layer can be used as an anode layer of the second OLED layer. In another example, the second OLED layer includes an anode layer and a functional layer. The second pixel electrode layer can be used as an anode layer of the second OLED layer. The second TFT source layer and the second pixel electrode layer are formed by the same IGZO thin film by utilizing a forming pattern process.

Figure 2:
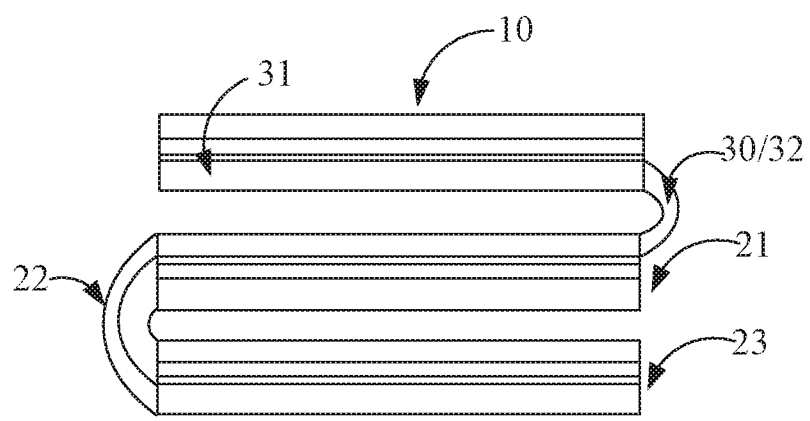
FIG. 2 is a first structural schematic diagram of the preferred embodiment of a display assembly in folded state according to the present disclosure.

Please refer to FIG. 2, an area of a rear surface of the flexible substrate 30 corresponding to the first display device 10 is over another area of the rear surface of the flexible substrate 30 corresponding to the first display section 21, and a front surface of the first display section 21 is over a front surface of the second display section 23. In this case, the front surface means the surface for displaying images and the rear surface means the surface is not for displaying images.

In a folded state, the first display device 10 of the display assembly displays images and the second display device 20 doesn't display images. In an unfolded state, the first display device 10, the first display section 21 of the second display device 20 and the second display section 23 can combine to display the images.

Figure 3:
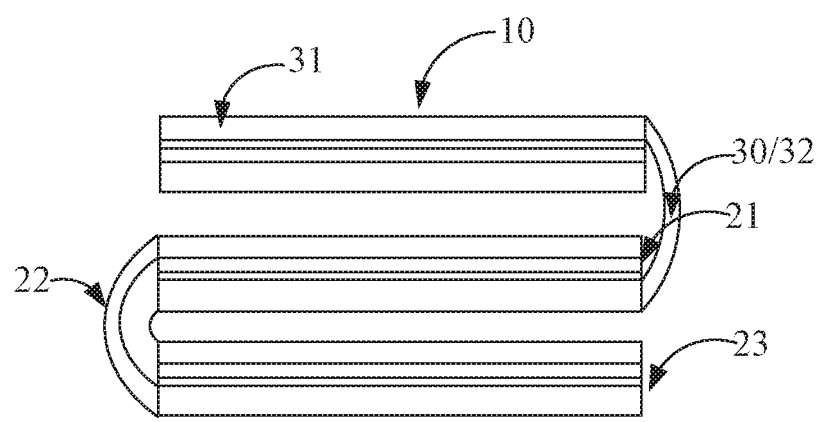
FIG. 3 is a second structural schematic diagram of the preferred embodiment of a display assembly in folded state according to the present disclosure.

In the preferred embodiments, as shown in FIG. 3, in the display assembly, a width of the connecting section 30 is larger than a sum of a thickness of the first display device 10 and a thickness of the second display device 20. A front surface of the first display device 10 overlaps with a front surface of the first display section 21, and a rear surface of the first display section 21 overlaps with a rear surface of the second display section 23. In this case, the front surface means the surface for displaying images and the rear surface means the surface which is not for displaying images.

In a folded state, the second display section 23 of the second display device 20 in the display assembly displays images and the first display device 10 and the first display section 21 of the second display device 20 doesn't display images. In an unfolded state, the first display device 10, the first display section 21 of the second display device 20 and the second display section 23 can combine to display the images.

The present invention provides a display assembly and a terminal device and utilizes a flexible substrate to fold the first display device and the second display device partially. The present invention utilizes partially foldable second display device to accomplish the internal folding and to enlarge the display area of the terminal device and to realize good portability.

Figure 4:
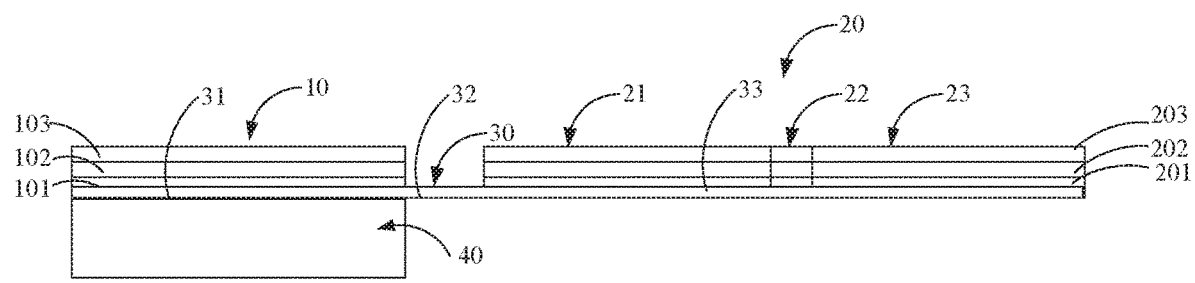
FIG. 4 is a structural schematic diagram of the preferred embodiment of a terminal device according to the present disclosure.

Please refer to FIG. 4, the present invention provides a terminal device and the terminal device comprises any one display assembly disclosed in the embodiments. The terminal device includes a housing 40 having a circuit board, a sensor and a wireless circuit within. The display assembly is disposed in the front surface of the housing 40.

In the structural schematic diagram of the display assembly, it comprises a first display device 10, a second display device 20 and a flexible substrate 30. The first display device 10 and the second display device 20 are disposed on the flexible substrate 30. There is no need to dispose another substrate. A flexible substrate 30 comprises, along a horizontally arranged direction, a first section 31, a connecting section 32 and a second section 33 in sequence. A first display device 10 is disposed on the first section 31 of the flexible substrate 30. The first display device 10 is an OLED display or an AMOLED display. AMOLED is Active-Matrix Organic Light Emitting Diode. The first display device 10 is rectangular or a similar shape.

The flexible substrate 30 is a foldable substrate. A metal wire is disposed in the connecting section 32 of the flexible substrate 30 and electrically connected to the first display section 21 and the first display device 10.

The first display device 10 comprises a first display layer 101, a first optical glue connection layer 102 and a first transparent protection layer 103, the first transparent protection layer 103 mounted on a front surface of the first display layer 101 through the first optical glue connection layer 102. In the preferred embodiments, the first transparent protection layer 103 is a glass cover or other kinds of transparent cover such as transparent layer.

Furthermore, the second display device 20 comprises a second display layer 201, a second optical glue connection layer 202 and a flexible transparent protection layer 203 and the flexible transparent protection layer 203 is mounted on the second display layer 201 through the second optical glue connection layer 202; the first display section 21, the foldable section 22 and the second display section 23 are located on the second display layer 201. The flexible transparent protection layer 203 is made of foldable flexible materials and can be folded with the first display section 21, the foldable section 22 and the second display section 23 and will not fall off.

The first display layer 101 electrically connects to the second display layer 201 through the metal wire.

Specifically, the first display layer 101 and the second display layer 201 are flexible display layers.

The first display layer 101 comprises a first TFT source layer, a first pixel electrode layer and a first OLED layer on the first section 31 of the flexible substrate 30. The first OLED layer includes a cathode layer and a functional layer. The first pixel electrode layer can be used as an anode layer of the first OLED layer. In another example, the first OLED layer includes an anode layer and a functional layer. The first pixel electrode layer can be used as a cathode layer of the first OLED layer. The first TFT source layer and the first pixel electrode layer are formed by the same IGZO thin film by utilizing a forming pattern process.

The second display layer 201 comprises a second TFT source layer, a second pixel electrode layer and a second OLED layer. The second OLED layer includes a cathode layer and a functional layer. The second pixel electrode layer can be used as an anode layer of the second OLED layer. In another example, the second OLED layer includes an anode layer and a functional layer. The second pixel electrode layer can be used as an anode layer of the second OLED layer. The second TFT source layer and the second pixel electrode layer are formed by the same IGZO thin film by utilizing a forming pattern process.

The present invention provides a display assembly and a terminal device and utilizes a flexible substrate to fold the first display device and the second display device partially. The present invention utilizes partially foldable second display device to accomplish the internal folding and to enlarge the display area of the terminal device and to realize good portability.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display assembly, comprising:
    a flexible substrate comprising, along a horizontally arranged direction, a first section, a connecting section and a second section in sequence;
    a first display device disposed on the first section of the flexible substrate;
    a second display device disposed on the second section of the flexible substrate, the second display device comprising a first display section, a foldable section and a second display section, which connect with one another in sequence; and
    a metal wire disposed at the connecting section of the flexible substrate and electrically connected to the first display section and the first display device;
    when in a folded state, an area of a rear surface of the flexible substrate corresponding to the first display device is over another area of the rear surface of the flexible substrate corresponding to the first display section, and a front surface of the first display section is over a front surface of the second display section; and
    wherein the first display device comprises a first display layer, a first optical glue connection layer and a first transparent protection layer, and the first transparent protection layer is mounted on a front surface of the first display layer through the first optical glue connection layer.

2. The display assembly of claim 1, wherein the second display device comprises a second display layer, a second optical glue connection layer, and a flexible transparent protection layer; the flexible transparent protection layer is mounted on the second display layer through the second optical glue connection layer; and the first display section, the foldable section, and the second display section are located on the second display layer.

3. The display assembly of claim 2, wherein the first display layer electrically connects to the second display layer through the metal wire.

4. The display assembly of claim 2, wherein the first display layer and the second display layer are flexible display layers.

5. The display assembly of claim 1, wherein the first transparent protection layer is a glass cover.

6. The display assembly of claim 1, wherein a width of the connecting section is larger than a sum of a thickness of the first display device and a thickness of the second display device.

7. A display assembly, comprising:
    a flexible substrate comprising, along a horizontally arranged direction, a first section, a connecting section and a second section in sequence;
    a first display device disposed on the first section of the flexible substrate;
    a second display device disposed on the second section of the flexible substrate, the second display device comprising a first display section, a foldable section, and a second display section, which connect with one another in sequence; and
    a metal wire disposed in the connecting section of the flexible substrate and electrically connected to the first display section and the first display device.

8. The display assembly of claim 7, wherein, when in a folded state, an area of a rear surface of the flexible substrate corresponding to the first display device is over another area of the rear surface of the flexible substrate corresponding to the first display section, and a front surface of the first display section is over a front surface of the second display section.

9. The display assembly of claim 7, wherein the first display device comprising a first display layer, a first optical glue connection layer and a first transparent protection layer, the first transparent protection layer mounted on the first display layer through the first optical glue connection layer.

10. The display assembly of claim 9, wherein the second display device comprises a second display layer, a second optical glue connection layer and a flexible transparent protection layer, the flexible transparent protection layer is mounted on the second display layer through the second optical glue connection layer and the first display section, the foldable section and the second display section are located on the second display layer.

11. The display assembly of claim 10, wherein the first display layer electrically connects to the second display layer through the metal wire.

12. The display assembly of claim 10, wherein the first display layer and the second display layer are flexible display layers.

13. The display assembly of claim 9, wherein the first transparent protection layer is a glass cover.

14. The display assembly of claim 8, wherein a width of the connecting section is larger than a sum of a thickness of the first display device and a thickness of the second display device.

15. A terminal device, comprising a case and a display device disposed in the case, the display device comprising:
 a flexible substrate comprising, along a horizontally arranged direction, a first section, a connecting section and a second section in sequence;
  a first display device disposed on the first section of the flexible substrate;
  a second display device disposed on the second section of the flexible substrate, the second display device comprising a first display section, a foldable section, and a second display section, which connect with one another in sequence; and
  a metal wire disposed in the connecting section of the flexible substrate and electrically connected to the first display section and the first display device.

16. The terminal device of claim 15, wherein, when in a folded state, an area of a rear surface of the flexible substrate corresponding to the first display device is over another area of the rear surface of the flexible substrate corresponding to the first display section, and a front surface of the first display section is over a front surface of the second display section.

17. The terminal device of claim 15, wherein the first display device comprising a first display layer, a first optical glue connection layer and a first transparent protection layer, the first transparent protection layer mounted on the first display layer through the first optical glue connection layer.

18. The terminal device of claim 17, wherein the second display device comprises a second display layer, a second optical glue connection layer and a flexible transparent protection layer and the flexible transparent protection layer is mounted on the second display layer through the second optical glue connection layer, and the first display section, the foldable section and the second display section are located on the second display layer.

19. The terminal device of claim 18, wherein the first display layer electrically connects to the second display layer through the metal wire.

20. The terminal device of claim 18, wherein the first display layer and the second display layer are flexible display layers.

* * * * *